United States Patent [19]

Kauffman

[11] Patent Number: 5,189,382
[45] Date of Patent: Feb. 23, 1993

[54] ELECTRICAL FILTER WITH ORTHOGONALLY CONDUCTING CAPACITORS

[76] Inventor: George M. Kauffman, 14 Abigale Dr., Hudson, Mass. 01749

[21] Appl. No.: 812,335

[22] Filed: Dec. 23, 1991

[51] Int. Cl.$^5$ .............................................. H03H 7/01
[52] U.S. Cl. ..................... 333/169; 333/181; 333/185
[58] Field of Search ............... 333/167, 168, 169, 170, 333/175, 177, 181, 184, 185, 12

[56] References Cited

U.S. PATENT DOCUMENTS

| | | | |
|---|---|---|---|
| 3,879,691 | 4/1975 | Fritz | 333/185 X |
| 4,363,009 | 12/1982 | Malcolm et al. | 333/168 X |
| 4,746,557 | 5/1988 | Sakamoto et al. | 333/184 X |
| 4,821,005 | 4/1989 | Kling | 333/185 X |
| 4,881,050 | 11/1989 | Swanson, Jr. | 333/185 |

Primary Examiner—Paul M. Dzierzynski
Assistant Examiner—Seung Ham
Attorney, Agent, or Firm—John E. Toupal; Harold G. Jarcho

[57] ABSTRACT

A capacitor filter circuit including an input electrode, an output electrode, a ground electrode, a first input capacitor connected between the input electrode and the ground electrode and a second input capacitor connected in parallel with the first input capacitor between the input electrode and the ground electrode. Also included in the circuit is a first output capacitor connected between the output electrode and the ground electrode, a second output capacitor connected in parallel with the first output capacitor between the output electrode and the ground electrode and an inductive means coupled between the input electrode and the output electrode.

18 Claims, 1 Drawing Sheet

ELECTRICAL FILTER WITH ORTHOGONALLY CONDUCTING CAPACITORS

BACKGROUND OF THE INVENTION

This invention relates generally to an electrical filter and, more particularly, to an electrical filter having a plurality of capacitors configured to provide superior performance.

Pi filters are used commonly in electrical circuitry. The fundamental properties of low pass filters are well established in the art. When employed as passive low pass filters, capacitive coupling to an electrical conductor at high frequencies becomes a critical element. Discrete leaded capacitors are not suitable at high frequencies because of the inherent self inductance associated with even the shortest of leads. Any practical connection length in the capacitive circuit will interfere with the proper operation of a low pass filter, due to the inductance impedance of these leads.

The object of this invention, therefore, is to provide an improved low pass capacitive filter circuit.

SUMMARY OF THE INVENTION

The invention is a capacitor filter circuit including an input electrode; an output electrode; a ground electrode; a first input capacitor connected between the input electrode and the ground electrode and a second input capacitor connected in shunt with the first input capacitor between the input electrode and the ground electrode.

Also included in the circuit is a first output capacitor connected between the output electrode and the ground electrode, a second output capacitor connected in shunt with the first output capacitor between the output electrode and the ground electrode and an inductive means coupled between the input electrode and the output electrode. This arrangement facilitates a selection of individual capacitors to provide wide frequency range performance.

According to one feature of the invention, the first input capacitor is arranged to conduct current in a first substantially rectilinear direction, the second input capacitor is arranged to conduct current in a second substantially rectilinear direction substantially orthogonal to the first direction, the first output capacitor is arranged to conduct current in a third substantially rectilinear direction, and the second output capacitor is arranged to conduct current in a fourth substantially rectilinear direction substantially orthogonal to the third direction. Because of the orthogonally directed current flow, the circuit creates no inductive interaction between the capacitors.

According to another feature of the invention, the first and fourth directions are substantially parallel and the second and third directions are substantially parallel. The parallel arrangement provides the desired orthogonal current flow.

According to still other features, the invention includes a base supporting the first and second output capacitors in a substantially planar array, and the inductive means also is supported by the base and projects a substantial distance transversely to the planar array. This arrangement reduces the base area required in support of the circuit filter.

According to yet other features of the invention, the first and second input capacitors and the first and second output capacitors are arranged in a rectangular configuration, and the inductive means is supported by the base in a position surrounded by the capacitor configuration. This configuration facilitates mounting of the inductive means above the capacitor array.

According to further features of the invention, the inductive means is an annular inductive element, and the input and output electrode are connected by a conductor extending through the annular inductive element. This arrangement facilitates connection of the filter circuit in a neat, compact configuration.

According to additional features of the invention, the base comprises an insulator surface supporting the first and second input capacitors, the first and second output capacitors, and the inductive element; the input electrode comprises an input conductive plate supported on the surface and connected to first ends of the first and second input capacitors; the output electrode means comprises an output conductive plate supported on the surface and connected to first ends of the first and second output capacitors; and the ground electrode comprises a first ground conductive plate supported on the surface and connected to an opposite end of the first input capacitor and an opposite end of the first output capacitor, and a second ground conductive plate supported on the surface and connected to an opposite end of the second input capacitor and an opposite end of the second output capacitor.

According to another feature of the invention, the surface is rectangular and the plates comprise conductive foil elements supported on corner portions of the rectangular surface. The use of foil electrodes in this configuration simplifies the filter structurally.

According to a further feature of the invention, the input and output conductive plates are arranged diagonally on the surface, and the first and second ground conductive plates are arranged diagonally on the surface. This arrangement further simplifies the filter configuration.

According to a further feature of the invention, the first and second input capacitors are of unequal size and the first and second output capacitors are of unequal size. The unequal sized capacitors can provide a desired frequency response.

DESCRIPTION OF THE DRAWINGS

These and other objects and features of the invention will become more apparent upon a perusal of the following description taken in conjunction with the accompanying drawings wherein.

DESCRIPTION OF THE PREFERRED EMBODIMENT

Figure 1:
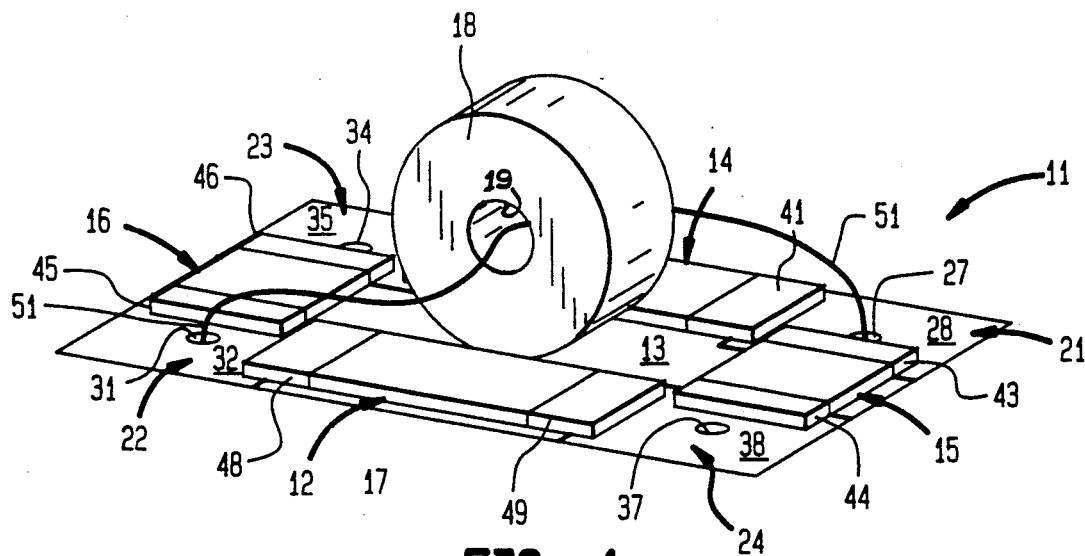
FIG. 1 is a perspective view of a capacitor filter according to the invention.
Figure 2:
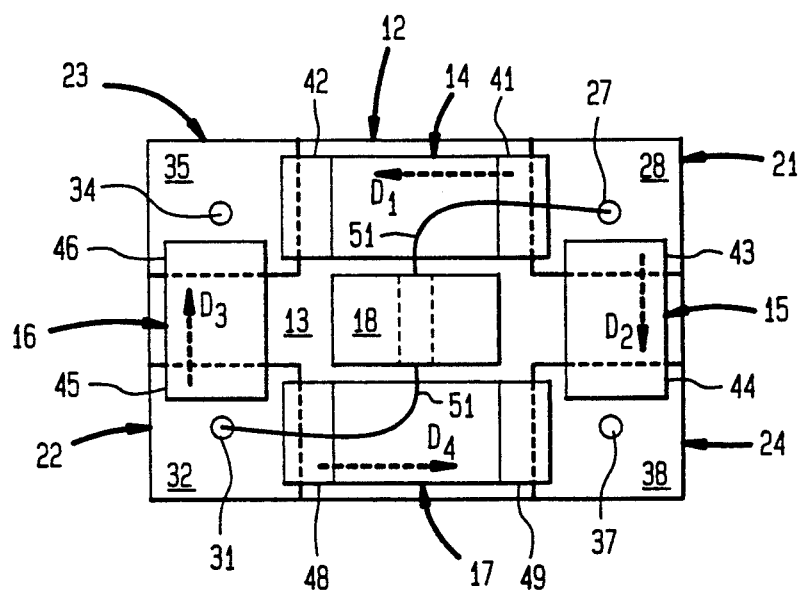
FIG. 2 is a top view of the capacitor filter shown in FIG. 1.
Figure 3:
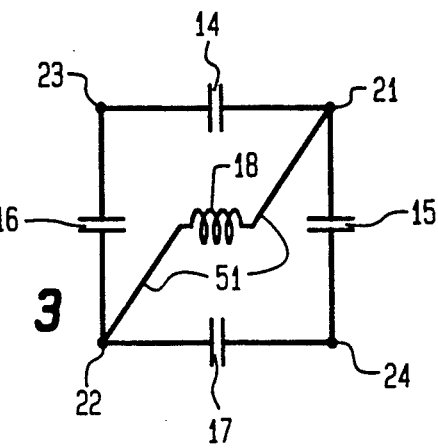
FIG. 3 is a schematic circuit diagram of the capacitor filter shown in FIGS. 1 and 2.

Illustrated in FIGS. 1-3 is a capacitor filter 11 constructed in accordance with the invention. A base 12 consisting, for example, of a circuit board defines a rectangular electrical insulator surface 13. Supported on the insulator surface 13 are a first input capacitor 14, a second input capacitor 15, a first output capacitor 16 and a second output capacitor 17. An annular inductive element formed of a ferritic material and defining an opening 19 also is supported on the insulator surface 13.

Disposed at the corners of the insulator surface 13 are, respectively, an input electrode assembly, an output electrode assembly 22, a first ground electrode assembly 23 and a second ground electrode assembly 24.

The input electrode assembly 21 includes an input pin 27 and a conductive input plate 28 consisting, for example, of copper foil connected to the pin 27 and supported on one corner portion of the insulator surface 13. Included in the output electrode assembly 31 is an output pin 31 and a conductive output plate 32 consisting, for example, of copper foil, connected to the pin 31 and supported on another corner portion of the insulator surface 13. The first ground electrode assembly 23 also includes a first ground pin 34 and a first conductive ground plate 35 preferably formed of copper foil, connected to the pin 34 and supported on another corner portion of the insulator surface 13. Similarly, the second ground electrode assembly 23 includes a second ground pin 37 and a second conductive ground plate 38 preferably formed of copper foil, connected to the ground pin 37 and supported on another corner portion of the insulator surface 13.

The first input capacitor 14 has one end 41 connected to the conductive input plate 28 and an opposite end 42 connected to the first conductive ground plate 35. One end 43 of the second input capacitor 15 also is connected to the conductive input plate 28 while an opposite end 44 thereof is connected to the second conductive ground plate 38. In a similar manner, the first output capacitor 16 has one end 45 connected to the conductive output plate 32 and an opposite end 46 connected to the first conductive ground plate 35 while the second output capacitor 17 has one end 48 also connected to the conductive output plate 32 and an opposite end 49 connected to the second conductive ground plate 38. Thus, as shown in FIG. 3, the first and second input capacitors 14, 15 are connected in shunt between the input electrode 21 and the ground electrodes 23, 24 while the output capacitors 16, 17 are connected in shunt between the output electrode 22 and the ground electrodes 23, 24. In addition, a conductor 51 extending through the opening 19 in the conductive element 18 is connected between the input electrode 21 and the output electrode 23.

As shown in FIGS. 1 and 2, the capacitors 14–17 are supported on the insulator surface 13 in a planar array surrounding the inductive element 18 which projects transversely therefrom. The first input capacitor 14 is arranged to conduct current in a first rectilinear direction D1 (FIG. 2), the second input capacitor 15 is arranged to conduct current in a second rectilinear direction D2, the first output capacitor 16 is arranged to conduct current in a third rectilinear direction D3 and the second output capacitor 17 is arranged to conduct current in a fourth rectilinear direction D4. In addition, the arrangement of the capacitors 14–17 on the insulator surface 13 is such that the first direction D1 is orthogonal to the second direction D2 and parallel to the fourth direction D4 while the third direction D3 is orthogonal to the fourth direction D4 and parallel to the second direction D2.

OPERATION

When connected appropriately into an electrical circuit, the filter 11 functions to conduct unwanted electrical noise to ground. Currents conducted by the first and second input capacitors 14, 15 produce no inductive interaction in that the directions of current flow D1, D2 are orthogonal. Similarly, currents conducted by the first and second output capacitors 16, 17 produce no inductive interaction because the directions of current flow D3, D4 are orthogonal. Consequently, undesirable magnetic field interaction generated by the capacitors 14–17 is significantly reduced. Preferably, the first and second input capacitors 14, 15 are of unequal physical size and value so as to facilitate for each a selection of an electrical characteristic that provides a desired frequency performance. The same advantage is obtained by preferably selecting the output capacitors 16, 17 with unequal physical size and value.

An additional advantage of the filter 11 is provided by the arrangement wherein the inductive element 18 projects transversely from the planar array of capacitors 14–17 Because of the vertical overlap between the components, the filter 11 requires less overall area which is desirable in many circuit board applications.

Obviously, many modifications and variations of the present invention are possible in light of the above teachings. It is to be understood, therefore, that the invention can be practiced otherwise than as specifically described.

What is claimed is:

1. An electrical filter comprising:
   input electrode means;
   output electrode means;
   ground electrode means;
   a first input capacitor connected between said input electrode means and said ground electrode means, said first input capacitor having conductive ends separated in a first substantially rectilinear direction and joined by a dielectric portion such that current through said dielectric portion flows in said first rectilinear direction;
   a second input capacitor connected in shunt with said first input capacitor between said input electrode means and said ground electrode means, said second input capacitor having conductive ends separated in a second substantially rectilinear direction substantially orthogonal to said first rectilinear direction and joined by a second dielectric portion such that current through said second dielectric portion flows in said second rectilinear direction;
   a first output capacitor connected between said output electrode means and said ground electrode means;
   a second output capacitor connected in shunt with said first output capacitor between said output electrode means and said ground electrode means; and
   an inductive means coupled between said input electrode means and said output electrode means.

2. An electrical filter according to claim 1 wherein said first output capacitor has conductive ends separated in a third substantially rectilinear direction and joined by a third dielectric portion such that current through said third dielectric portion flows in said third substantially rectilinear direction, and said second output capacitor has conductive ends separated in a fourth substantially rectilinear direction substantially orthogonal to said third rectilinear direction and joined by a fourth dielectric portion such that current through said fourth dielectric portion flows in said fourth substantially rectilinear direction.

3. An electrical filter according to claim 2 wherein said first and fourth rectilinear directions are substantially parallel and said second and third rectilinear directions are substantially parallel.

4. An electrical filter according to claim 3 including base means supporting said first and second input capacitors and said first and second output capacitors in a substantially planar array.

5. An electrical filter according to claim 4 wherein said inductive means comprises an inductive element that projects a substantial distance transversely to said planar array.

6. An electrical filter according to claim 5 wherein said first and second input capacitors and said first and second output capacitors are arranged in a rectangular configuration, and said inductive element is surrounded by said configuration.

7. An electrical filter according to claim 6 wherein said inductive element is annular, and said input and output electrode means are connected by a conductor extending through said annular inductive element.

8. An electrical filter according to claim 7 wherein said base means comprises an insulator surface supporting said first and second input capacitors, said first and second output capacitors, and said inductive element; said input electrode means comprises an input conductive plate supported on said surface and connected to first ends of said first and second input capacitors; said output electrode means comprises an output conductive plate supported on said surface and connected to first ends of said first and second output capacitors; and said ground electrode means comprises a first ground conductive plate supported on said surface and connected to an opposite end of said first input capacitor and an opposite end of said first output capacitor, and a second ground conductive plate supported on said surface and connected to an opposite end of said second input capacitor and an opposite end of said second output capacitor.

9. An electrical filter according to claim 8 wherein each of said plates comprises a conductive foil element.

10. An electrical filter according to claim 9 wherein said surface is rectangular and said foil elements are supported on corner portions of said rectangular surface.

11. An electrical filter according to claim 10 wherein said input and output conductive plates are arranged diagonally on said surface, and said first and second ground conductive plates are arranged diagonally on said surface.

12. An electrical filter according to claim 1 including a base means supporting said first and second input capacitors and said first and second output capacitors in a substantially planar array.

13. An electrical filter according to claim 12 wherein said inductive means comprises an inductive element that projects a substantial distance transversely to said planar array.

14. An electrical filter according to claim 13 wherein said first and second input capacitors and said first and second output capacitors are arranged in a rectangular configuration, and said inductive element is disposed within said configuration.

15. An electrical filter according to claim 14 wherein said base means comprises an insulator surface supporting said first and second input capacitors, said first and second output capacitors, and said inductive element; said input electrode means comprises an input conductive plate supported on said surface and connected to first ends of said first and second input capacitors; said output electrode means comprises an output conductive plate supported on said surface and connected to first ends of said first and second output capacitors; and said ground electrode means comprises a first ground conductive plate supported on said surface and connected to an opposite end of said first input capacitor and an opposite end of said first output capacitor, and a second ground conductive plate supported on said surface and connected to an opposite end of said second input capacitor and an opposite end of said second output capacitor.

16. An electrical filter according to claim 15 wherein each of said plates comprises a conductive foil element.

17. An electrical filter according to claim 16 wherein said surface is rectangular and said foil elements are supported on corner portions of said rectangular surface.

18. An electrical filter according to claim 17 wherein said inductive means comprises an annular inductive element, and said input and output electrode means are connected by a conductor extending through said annular inductive element.

* * * * *